(12) United States Patent
Roizin

(10) Patent No.: US 6,297,984 B1
(45) Date of Patent: Oct. 2, 2001

(54) STRUCTURE AND METHOD FOR PROTECTING INTEGRATED CIRCUITS DURING PLASMA PROCESSING

(75) Inventor: Yakov Roizin, Atula (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/474,376

(22) Filed: Dec. 29, 1999

(51) Int. Cl.[7] .................................................. G11C 13/00
(52) U.S. Cl. ............................................. 365/106; 365/112
(58) Field of Search .................................... 365/106, 112, 365/115, 116; 250/214 C

(56) References Cited

U.S. PATENT DOCUMENTS

| | | | |
|---|---|---|---|
| 4,800,288 | * | 1/1989 | Inagaki et al. ........................ 365/112 |
| 4,864,538 | * | 9/1989 | Buzak .................................. 365/112 |
| 4,896,149 | * | 1/1990 | Buzak et al. ......................... 365/112 |
| 5,517,151 | * | 5/1996 | Kubota ................................. 365/112 |
| 5,883,830 | * | 3/1999 | Hirt et al. ............................ 365/115 |
| 5,900,625 | * | 5/1999 | Baumgartner ..................... 250/214 C |

OTHER PUBLICATIONS

Shin et al., "Impact Of Plasma Charging Damage and Diode Protection On Scaled Thin Oxide," IEEE, p. 3.1–3.4, (1993).
Amerasekera et al., "ESD Protection Design And Applications To Bidirectional Antenna Protection For Sub–5 nm Gate Oxides," American Vacuum Society, (1997).

* cited by examiner

Primary Examiner—Trong Phan
(74) Attorney, Agent, or Firm—Bever, Hoffman & Harms, LLP; Patrick T. Beaver

(57) ABSTRACT

A protection circuit and method for preventing high word line voltages during plasma processing of integrated circuits. The protection circuit includes a shunt transistor connected between each word line and ground, and a light sensitive element connected to the gate of each shunt transistor. During plasma processing, the plasma glow activates the light sensitive element, which generates a corresponding voltage that is applied to a gate of the shunt transistors. Consequently, the built-up potentials in the word lines are shunted to ground throughout the plasma process.

13 Claims, 4 Drawing Sheets

STRUCTURE AND METHOD FOR PROTECTING INTEGRATED CIRCUITS DURING PLASMA PROCESSING

FIELD OF THE INVENTION

The present invention relates to integrated circuits that are fabricated using plasma processing, such as plasma metal etch, plasma contact/via etch, plasma resist ash, and plasma enhanced chemical vapor deposition (PECVD). More specifically, the present invention relates to a structure and method used to shunt undesirable potentials generated in antenna electrodes during plasma processing.

RELATED ART

Flash EPROM and EEPROM memory devices typically include memory cells, each having diffused source and drain regions formed in a semiconductor substrate, and a floating gate structure (e.g., polysilicon and/or oxide-nitride-oxide (ONO)) that is formed on a gate oxide structure and located over a channel region extending between the source and drain regions. In an erased state, the floating gate stores a neutral charge that permits current flow between the source and drain regions of the memory cell. In a programmed state, the floating gate stores a negative charge that prevents current flow between the source and drain regions of the memory cell. During normal operation, programming/erasing of the floating gate are performed by injecting/drawing-off electrons and holes into/from the floating gate.

Flash EPROM and EEPROM memory devices typically include word lines located over the floating gate of each memory cell arranged in a row. These word lines provide control signals that are applied to associated floating gates during read, program, and erase operations of the memory cells. During these read, program, and erase operations, corresponding control signals are also transmitted to source and/or drain regions of the memory cells either through, for example, diffused bit lines or through metal conductors that are connected to the diffused source/drain regions by metal contacts that extend through a dielectric layer. In some cases, the diffused bit lines form source/drain regions of a column of memory cells.

Plasma processing, including plasma metal etch, plasma contact/via etch, plasma resist ash, and PECVD processes, is used during various stages of integrated circuit fabrication. For example, PECVD is often used to form a $SiO_2$ layer over the metal lines of integrated circuits. The plasma, or glow discharge, that is generated during plasma processing is produced by the application of a radio frequency (RF) field to a low pressure gas, thereby creating free electrons within the discharge region. In the case of PECVD, these free electrons collide with gas molecules to ionize the reactant gases and form energetic species that adsorb on the upper surface of an underlying wafer, thereby forming the $SiO_2$ layer.

During plasma processing, a partially-formed integrated circuit is subjected to potentials generated in the plasma by the free electrons and ions. While the bulk substrate of the integrated circuit is charged to a mean potential, the surface of the substrate is subjected to non-homogeneous local potentials that are caused by magnetic and electrostatic fields. In most cases, these magnetic and electrostatic fields are essentially stationary, thereby causing constant charging in regions of the wafer surface located in these electrostatic fields. Problems occur when the constant charging produces built-up potentials that, for example, exceed the programming (disturb) voltage of a floating gate structure, or force high currents through gate oxide structures in CMOS memory devices. In floating gate devices that include ONO structures, these excessive programming voltages can produce permanent charges in the ONO structures that is difficult to remove using "normal" erase procedures (i.e., the procedures designed to remove expected charges from the floating gate), or using non-destructive thermal treatment. In CMOS memory devices, high currents forced through the gate oxide structures result in oxide degradation that can lead to leakage current, and possible gate oxide breakdown.

What is needed is a structure and method that prevents undesirable potentials during plasma processing that produces undesirable ONO charges and gate oxide damage in flash EPROM, EEPROM, and CMOS ICs.

SUMMARY

The present invention is directed to a structure and method for preventing built-up word line and bit line potentials caused by plasma processing during the fabrication of an integrated circuit. In accordance with the present invention, a shunt transistor is connected between each word/bit line (elongated conductor) and ground, and a light sensitive element is connected to the gate of each shunt transistor. During plasma processing, the plasma glow causes the light sensitive element to generate a voltage that is applied to a gate of one or more shunt transistors. Consequently, the built-up potentials in the word/bit lines are shunted to ground throughout the plasma process, thereby preventing high metal/polysilicon line voltages that can charge/damage the floating gates and/or gate oxide structures of the integrated circuit.

In accordance with an embodiment of the present invention, the integrated circuit includes an array of cells arranged in rows and columns on a semiconductor substrate, elongated conductors (e.g., word lines) extending over the rows of memory cells, and a protection circuit located along a peripheral edge of the array. Each cell includes a diffused source region, a diffused drain region, a gate oxide structure formed over a channel located between the source and drain regions, and a gate structure formed on the gate oxide region. The word lines are electrically coupled (i.e., either directly connected or by capacitive coupling) to the gate structures of one row of the cells.

The protective circuit includes shunt transistors connected between the ends of each word line and a ground plate, and one or more light sensitive elements connected to the gates of the shunt transistors. In one embodiment, the light sensitive element includes a first photodiode connected between ground and the gate of the shunt transistor, and a second photodiode connected between the gate of the shunt transistor and the word line. A light shield covers the first photodiode, and the second photodiode is exposed to the plasma glow during the plasma process. In another embodiment, the light sensitive element is a solar cell that is connected between ground and the gate of the shunt transistor.

In another embodiment of the present invention, a method of producing integrated circuits includes forming a plurality of cells and a protection circuit on a substrate, forming an elongated conductor (e.g., metal word line) that extends over and is electrically coupled to the cells and connected to the protection circuit, and then performing a plasma process (e.g., forming an $SiO_2$ layer over the metal line using a PECVD process). The protective circuit includes a shunt transistor connected between the elongated conductor and ground, and a light sensitive element that is activated by the plasma glow generated during the plasma process to turn on the shunt transistor. By shunting the elongated conductor to ground during the plasma process, high voltages are prevented from being generated in the metal line during the plasma process, thereby protecting the cell from damage.

The novel aspects of the present invention will be more fully understood in view of the following description and drawings.

DETAILED DESCRIPTION

The present invention is described below with reference to non-volatile memory arrays, but may also be utilized in other types of integrated circuits. Specifically, the "cells" referred to in the following description are described as including floating gate structures (e.g., polysilicon and/or oxide-nitride-oxide (ONO) structures) that are programmed and erased in accordance with voltages applied to source, drain, and gate structures of the cell. While the present invention is primarily directed to preventing undesirable programming of these floating gates during plasma processes, the present invention may also be used to protect structures in other types of "cells" (i.e., that do not include floating gates). For example, when the "cells" of an integrated circuit are conventional field effect transistors (FETs), the present invention may be used to prevent gate oxide damage caused by excessive gate currents generated during subsequent plasma processing, such as plasma etching, plasma ashing, or the formation of post-metal $SiO_2$ using PECVD. Other embodiments incorporating the present invention will become apparent to those skilled in the art of integrated circuit design and fabrication from the following description.

Figure 1:
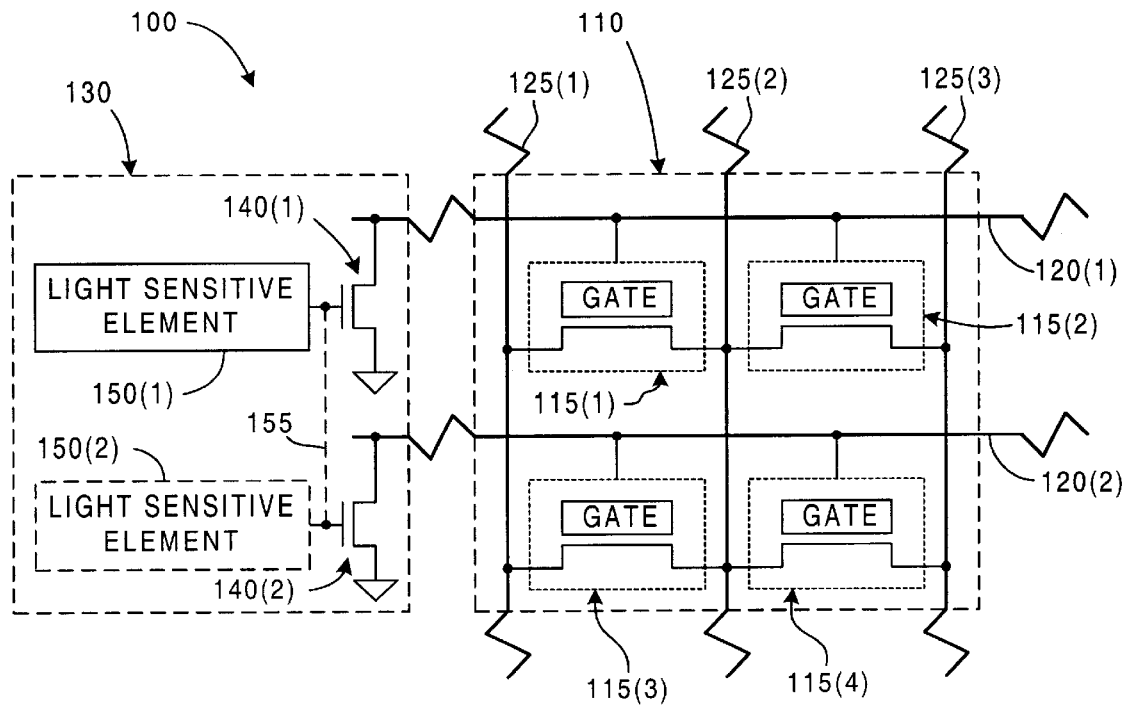
FIG. 1 is a simplified circuit diagram showing an integrated circuit incorporating the present invention.

FIG. 1 is a simplified circuit diagram showing an integrated circuit (IC) 100 in accordance with an embodiment of the present invention. IC 100 includes an array (e.g., a memory array) 110 formed in a first region of a substrate, parallel word lines 120(1) and 120(2) and parallel bit lines 125(1) through 125(3) extending through array 110, and protection circuit 130 located in a second region of the substrate located along a peripheral edge of array 110. Other control circuitry of IC 100 (such as word line and bit line driver circuitry) is not shown.

Array 110 includes a plurality of cells 115(1) through 115(4) that are arranged in rows and columns on a semiconductor substrate (not shown). Array 110 is shown with four cells for illustrative purposes only—actual arrays typically include a significantly larger number of cells. Each cell includes a first (e.g., source) terminal connected to a first bit line, a second (e.g., drain) terminal connected to a second bit line, and a gate structure that is electrically coupled to a word line. For example, cell 115(1) has a first terminal connected to bit line 125(1), a second terminal connected to bit line 125(2), and a gate structure (GATE) that is electrically coupled to word line 120(1).

As used herein, the term "electrically coupled" is intended to cover both physical connection and "purposeful" capacitive coupling. Physical connection occurs, for example, when cell 115(1) is a FET, and word line 120(1) directly connects the FET gate structure. Alternatively, "purposeful" capacitive coupling occurs, for example, when cell 115(1) is a non-volatile memory cell, word line 120(1) is capacitively coupled to a floating gate structure of the memory cell for purposes of programming and erasing charges stored on the floating gate structure. Such "purposeful" capacitive coupling may be achieved by direct contact between the word line and a control gate structure overlying the floating gate, or may be achieved from the word line and the floating gate. Note that the term "purposeful capacitive coupling" does not include incidental (weak) coupling between the various conductors/structures formed on IC 100. To be "purposeful", the capacitive coupling between two conductors/structures must be intended to perform a function (e.g., read, program, and erase operations) of IC 100.

In accordance with an embodiment of the present invention, word lines 120(1) and 120(2) are formed by elongated heavily-doped polysilicon structures that are formed over the gate structures of memory cells 115(1) through 115(4). Alternatively, word lines 120(1) and 120(2) are formed by metal lines etched from a first metal (i.e., "Metal 1") layer during the fabrication process of IC 100. In contrast, elongated diffused regions formed in the substrate (not shown) of IC 100 form bit lines 125(1) through 125(3). Note that bit line 125(2) is shared by, for example, cell 115(1) and 115(2). In another embodiment (not shown), an additional bit line may be provided between these cells such that cell 115(1) and 115(2) do not share bit line 125(2).

Referring again to FIG. 1, protection circuit 130 includes shunt transistors 140(1) and 140(2), and one or more light sensitive elements 150(1) and 150(2).

Each shunt transistor of protective circuit 130 has a first terminal connected to a word line, a second terminal connected to ground, and a gate terminal. For example, shunt transistor 140(1) is connected between word line 130(1) and ground, and shunt transistor 140(2) is connected between word line 130(2) and ground.

The one or more light sensitive elements of protective circuit 130 are used to connect the word lines to ground when IC 100 is exposed to a light source (e.g., the plasma glow generated during plasma processing). In one embodiment, one single light sensitive element is used to control the shunting operation in two or more word lines. For example, referring to FIG. 1, light sensitive element 150(1) is connected to the gate terminal of shunt transistor 140(1), and is connected by an optional conductor 155 to the gate terminal of shunt transistor 140(2). In another embodiment, one light sensitive element is provided for each word line 120(1) and 120(2). For example, instead of using optional conductor 155, optional light sensitive element 150(2) is connected to the gate terminal of shunt transistor 140(2).

During plasma processes, such as post-metal $SiO_2$ formation using a PECVD process, protective circuit 130 prevents high voltages on word lines 120(1) and 120(2) that undesirably program or otherwise damage the gate structures and/or gate oxide structures of cells 115(1) through 115(4) of IC 100. Specifically, the plasma glow activates the one or more light sensitive elements 150(1) and 150(2), thereby applying a high voltage at the gate terminals of shunt transistors 140(1) and 140(2). With shunt transistors 140(1) and 140(2) turned on, the potentials built-up on word lines 120(1) and 120(2) (which act as antenna electrodes) are shunted to ground. These built-up potentials disappear at the end of the recombination processes after the plasma is turned off. During subsequent "normal" operation of IC 100 (e.g., wherein cells 115(1) through 115(4) are utilized to store data), word lines 120(1) and 120(2) are used to transmit address signals from a word line driver (not shown), thereby accessing the gate structures of cells 115(1) through 115(4) for read, program, and erase operations. During these "normal" operations, the one or more light sensitive elements 150(1) and 150(2) are shielded from external light sources using, for example, a portion of a device package (not shown) housing IC 100, thereby maintaining shunt transistors 140(1) and 140(2) in an off (non-conducting) state.

Figure 2A:
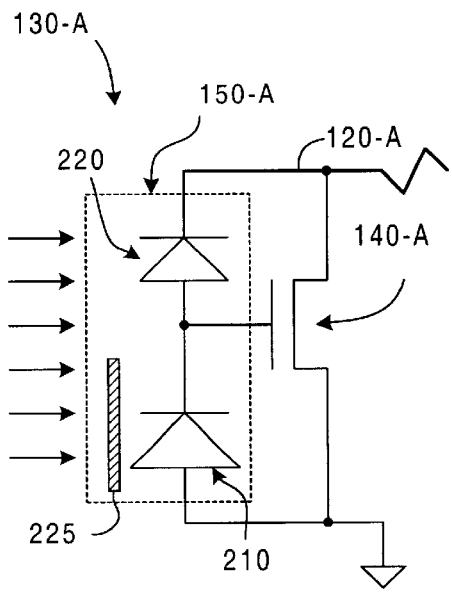
FIGS. 2(A) and 2(B) are simplified circuit diagrams showing alternative light sensitive elements utilized in the integrated circuit shown in FIG. 1.
Figure 2B:
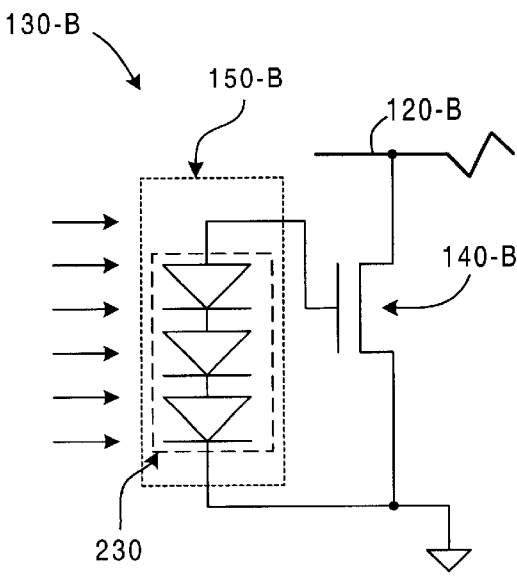

FIGS. 2(A) and 2(B) are simplified circuit diagrams illustrating a portion of protection circuit 130 (see FIG. 1) in accordance with two alternative embodiments of the present invention.

FIG. 2(A) shows a protection circuit 130-A including a shunt transistor 140-A connected between word line 120-A and ground, and a light sensitive element 150-A connected to the gate terminal of shunt transistor 140-A. Light sensitive element 150-A includes a first photodiode 210 connected between ground (voltage source) and the gate terminal of shunt transistor 140-A, a second photodiode 220 connected between the gate terminal of shunt transistor 140-A and word line 120-A, and a shield 225 formed over first photodiode 210. First photodiode 210 is substantially larger than second diode 220 (e.g., a ratio of the size (surface area) of first photodiode 210 to the size of second photodiode 220 is in the range of 10:1 to 100:1; i.e., approximately 50:1). In one embodiment, shield 225 is formed from a portion of the "Metal 1" (e.g., Al) layer during the IC fabrication process.

Protection circuit 130-A operates as follows. During fabrication, when light sensing element 150-A is exposed to plasma glow (indicated by the horizontal arrows located at the left edge of the figure), such as during PECVD, the resistance of second photodiode 220 is reduced significantly, thereby transmitting the high voltage generated on word line 120-A to the gate terminal of shunt transistor 140-A. This high gate voltage turns on shunt transistor 140-A, thereby shunting the high word line voltage to ground. In the absence of glow discharge (or other light), second photodiode 220 returns to a high resistance state, thereby effectively isolating the gate terminal of shunt transistor 140-A from word line 120-A.

FIG. 2(B) shows an alternative protection circuit 130-B that includes a shunt transistor 140-B connected between word line 120-B and ground, and a light sensitive element 150-B connected to the gate terminal of shunt transistor 140-B. Light sensitive element 150-B includes a solar cell 230 formed by series-connected photodiodes that are connected together by Metal 1 contacts. Solar cell 230 is connected between ground (voltage source) and the gate terminal of shunt transistor 140-B. In operation, solar cell 230 generates a high voltage that is applied to the gate terminal of shunt transistor 140-B when exposed to plasma glow (indicated by the horizontal arrows). This high gate voltage turns on shunt transistor 140-B, thereby shunting the word line 120-B to ground. Unlike the embodiment shown in FIG. 2(A), which requires one light sensitive element for each word line, one solar cell 230 can be used to control several shunt transistors. In the absence of glow discharge (or other light), solar cell 230 applies a low voltage that turns off shunt transistor 140-B.

Fabrication Process

Figure 3:
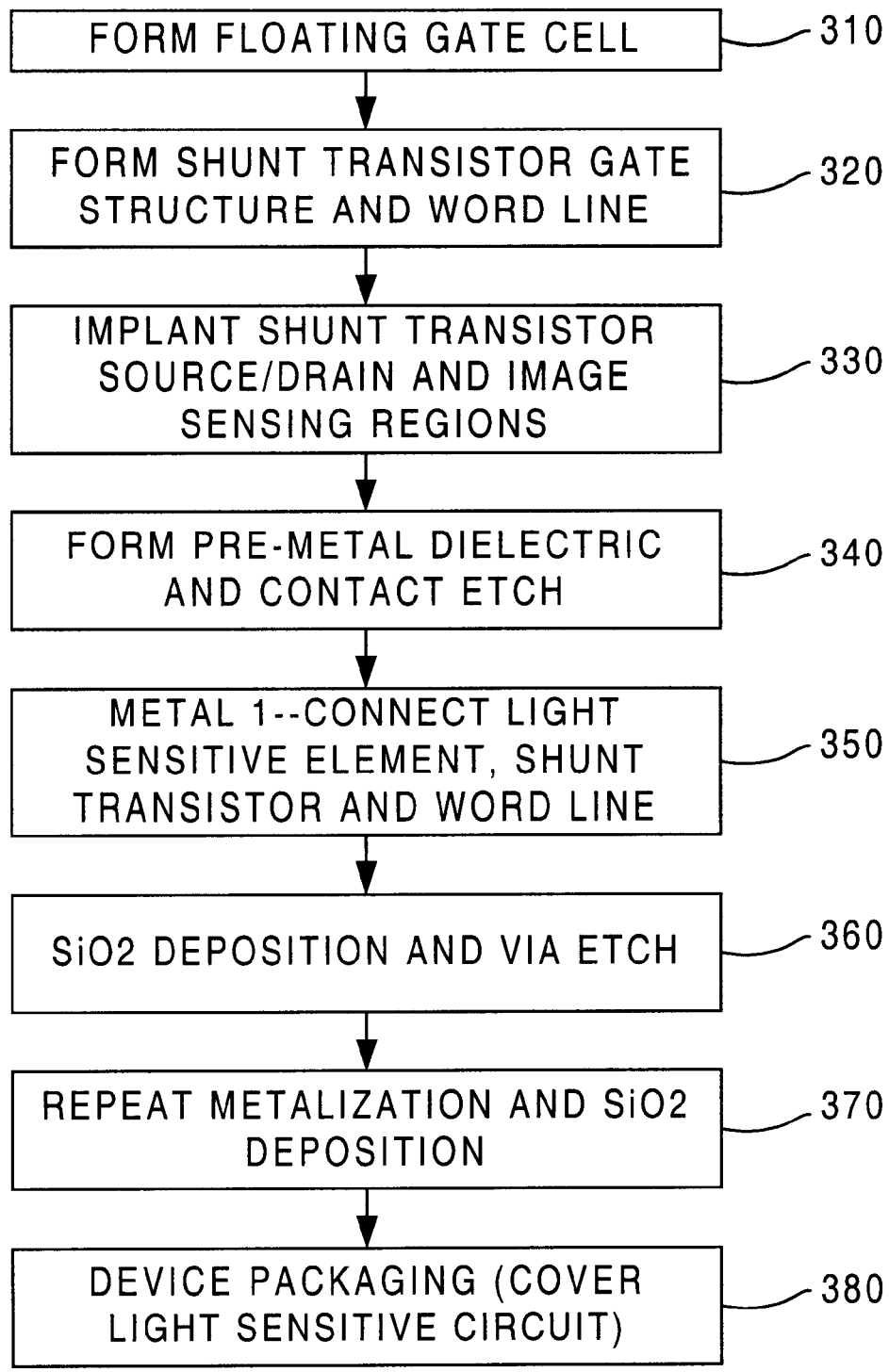
FIG. 3 is a flow diagram showing basic process steps used in the formation of an integrated circuit in accordance with the present invention.

FIG. 3 is a flow diagram showing a CMOS fabrication process according to an embodiment of the present invention. FIGS. 4(A) through 4(F) are cross sectional side views illustrating selected stages of the fabrication process that are identified in FIG. 3. The CMOS fabrication process shown in FIGS. 3 and 4(A) through 4(F) is specifically directed to the formation of an integrated circuit including non-volatile memory cells including oxide-nitride-oxide (ONO) structures. Those of ordinary skill in the art will recognize that the fabrication stages shown in these figures can be modified to produce other types of integrated circuits. In particular, it is important in many types of integrated circuits to shunt word and/or bit line voltages during plasma processing, for example, to protect fragile gate oxide structures in the cells of the integrated circuits. Therefore, the appended claims are not necessarily limited by the embodiment described below.

Figure 4A:
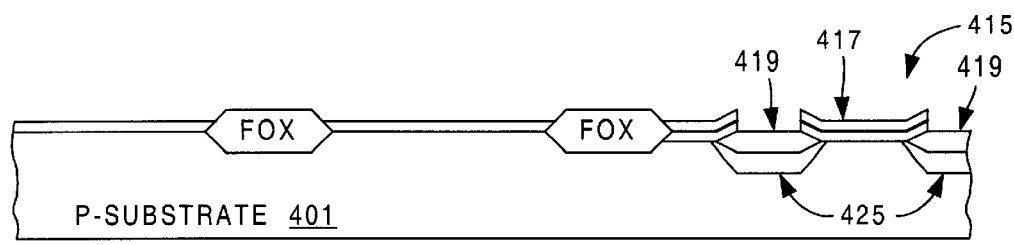
FIGS. 4(A) through 4(F) are cross-sectional side views showing the formation of a portion of the integrated circuit in according with the flow diagram shown in FIG. 3.

Referring to FIG. 3, the CMOS fabrication process begins with the formation of ONO non-volatile memory cells in a first area of a substrate (Step 310). Referring to FIG. 4(A), each memory cell 415 of the array includes an ONO structure 417 that extends between elongated oxide regions 419. Diffused bit line regions 425 extend under oxide regions 419. An example of a fabrication process used to form memory cell 415 is described in additional detail in co-owned and co-pending U.S. application Ser. No. 09/244,316, entitled "METHODS FOR FABRICATING A SEMICONDUCTOR CHIP HAVING CMOS DEVICES AND A FIELDLESS ARRAY", which is incorporated herein in its entirety.

Figure 4B:
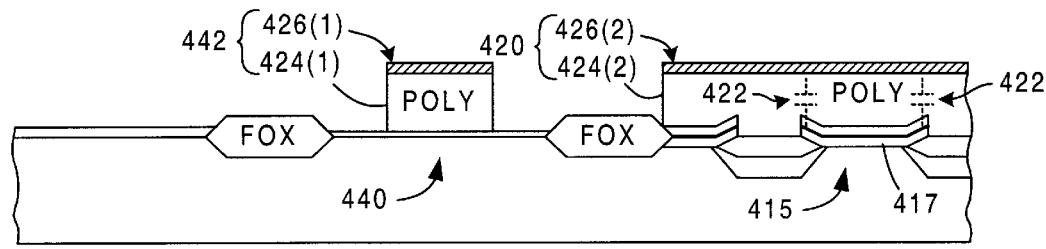

Returning to FIG. 3, the Step 320 of the CMOS fabrication process includes forming a polysilicon gate structure for the shunt transistor and a word line for transmitting control signals to the memory cells. Referring to FIG. 4(B), this step involves forming a highly doped polysilicon layer over memory cell 415 and other regions of substrate 401, and then etching the polysilicon layer to form word line 420 and a gate structure 442 of shunt transistor 440. In one embodiment, a Tungsten silicide layer is formed on an upper surface of polysilicon layer before etching. The resulting gate structure 442 includes a polysilicon (POLY) base portion 424(1) and a silicide portion 426(1). Similarly, the resulting word line 420 includes a polysilicon (POLY) base portion 424(2) and a silicide portion 426(2). Note that, in the present embodiment, polysilicon base portions 424(1) and 424(2) are etched from a single polysilicon layer during a single etching process. Similarly, silicide portions 426(1) and 426(2) are etched from a single silicide layer. Word line 420 extends over memory cell 415 and is purposefully capacitively coupled to the nitride layer of ONO structure 417 (as indicated by dashed capacitors 422). An example of a fabrication process used to form memory cell 415 is described in additional detail in U.S. application Ser. No. 09/244,316 (cited above).

Figure 4C:
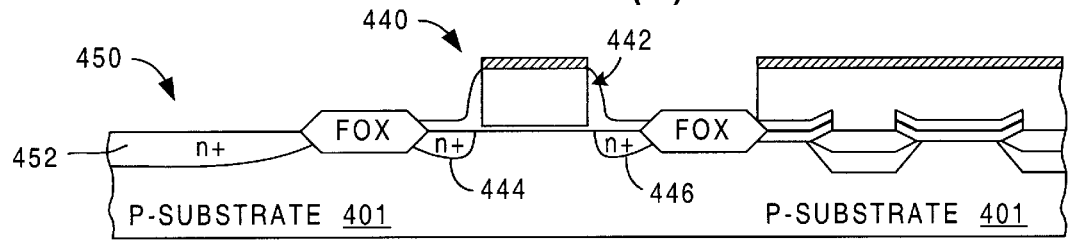

Step 330 (FIG. 3) of the CMOS fabrication process includes implanting source and drain regions of the shunt transistors, and implanting image sensing regions of the light sensitive element. Referring to FIG. 4(C), source region 444 and drain region 446 are implanted on opposite sides of gate structure 442 of shunt transistor 440 using well-known techniques. Similarly, light sensing region 452, which forms one photodiode of light sensitive element 450, is implanted using well known techniques in a third region of substrate 401 such that it is separated from shunt transistor 440 by a field oxide (FOX) region.

Figure 4D:
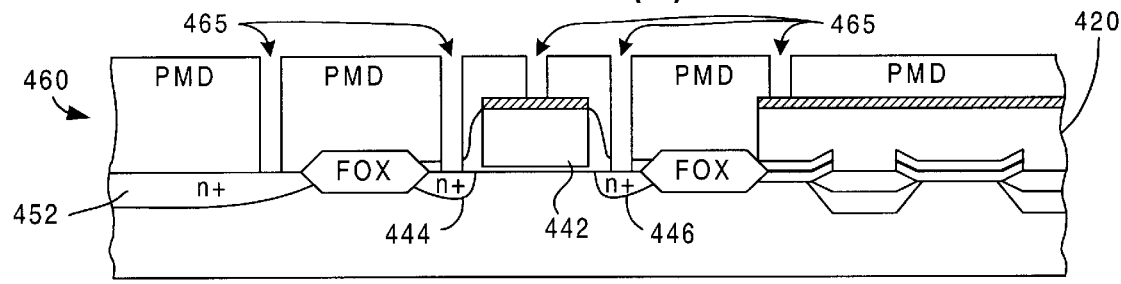
Figure 4E:
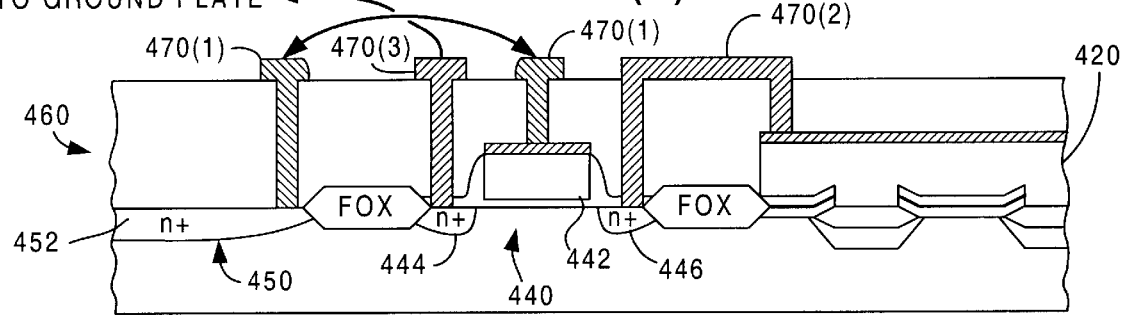

Step 340 (FIG. 3) of the CMOS fabrication process includes forming a pre-metal dielectric (e.g., borophosphosilicate glass) over the memory cell, shunt transistor, and light sensitive element, and then etching the pre-metal dielectric to form contact openings. Referring to FIG. 4(D), pre-metal dielectric layer 460 is formed using known techniques, and then etched to form openings 465 that expose selected structures of the integrated circuit. Specifically, contact openings 465 are formed through pre-metal dielectric layer 460 to word line 420, floating gate structure 442, source region 444, drain region 446, and light sensing region 452 using known techniques.

Step 350 (FIG. 3) of the CMOS fabrication process includes depositing a first metal (Metal 1) layer over the pre-metal dielectric, and etching the first metal layer to provide the necessary connections between the various structures of the integrated circuit. Specifically, referring to FIG. 4(E), a first metal contact 470(1) is provided between light sensing region 452 and floating gate structure 442, thereby connecting light sensitive element 450 to a gate terminal of shunt transistor 440. A second metal contact 470(2) is provided between drain region 446 of shunt transistor 440 and word line 420. A third metal contact 470(3) extends through pre-metal dielectric layer 460 to source region 444, thereby providing a connection to a ground plate (not shown) of the integrated circuit. From this point forward in the fabrication process, the protection circuit formed by shunt transistor 440 and light sensitive element 450 is fully formed and able to shunt word line voltages in the presence of a light source (such as the plasma glow generated during a PECVD process).

Figure 4F:
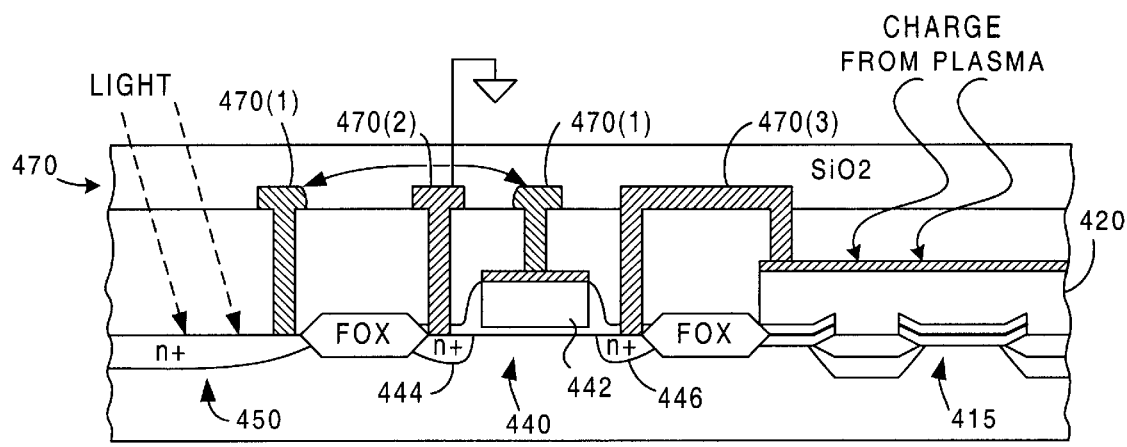

Step 360 (FIG. 3) of the CMOS fabrication process includes depositing an $SiO_2$ layer (or another dielectric material) over metal contacts 470(1) to 470(3), and then etching the $SiO_2$ layer to form vias for further metallization. FIG. 4(F) illustrates the process of forming an $SiO_2$ layer 470 using a PECVD process. As indicated at the right side of the figure, plasma generated, for example, during the PECVD process produces built-up potentials in word line 420, which acts as an antenna electrode. As discussed above, these built-up potentials can cause damage to memory cell 415. To prevent this damage, as indicated at the left side of FIG. 4(F), light generated by the plasma glow produced during the PECVD process is detected by light sensitive element 450. In response to this detect light, light sensitive element 450 is activated, and applies a high voltage signal to gate terminal 442 of shunt transistor 440 via metal contact structure 470(1). The high gate potential turns on shunt transistor 440, thereby allowing the built-up potential on word line 420 to discharge via metal contact 470(3), the channel extending between source region 444 and drain region 446, and metal contact structure 470(2) to ground.

Returning to FIG. 3, the fabrication process then performs a variation of Step 350 (metallization) and Step 360 ($SiO_2$ formation and etch) until the integrated circuit is completed (Step 370), and then the completed integrated circuit is packaged (Step 380). During the packaging process, the light sensitive element is covered, thereby preventing activation during "normal" operation of the integrated circuit.

Although the invention has been described in connection with several embodiments, it is understood that this invention is not limited to the embodiments disclosed, but is capable of various modifications which would be apparent to a person skilled in the art.

Figure 5:
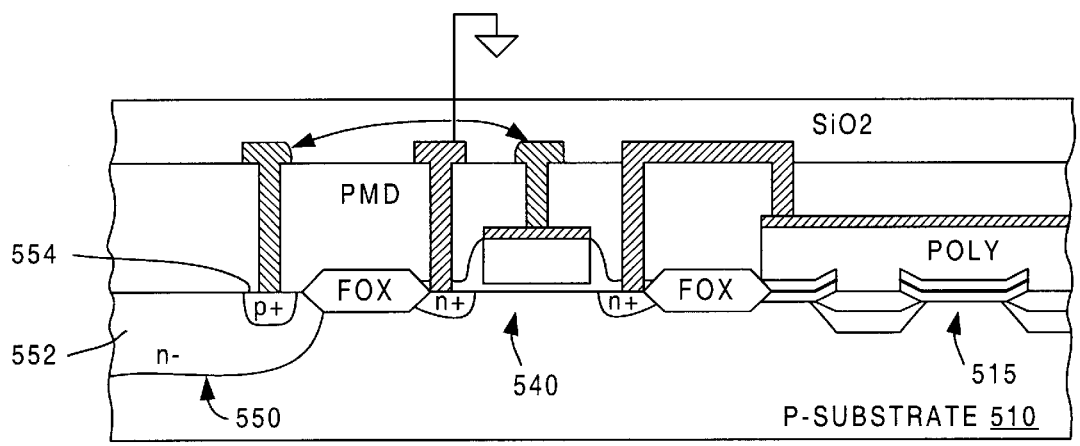
FIG. 5 is a cross-sectional side view showing a portion of an integrated circuit in accordance with another embodiment of the present invention.

For example, FIG. 5 is a cross-section view showing a partially formed integrated circuit including a cell 515, a shunt transistor 540 and a light sensitive element 550 that are fabricated in a manner similar to that described above. However, in contrast to the integrated circuit shown in FIGS. 4(A) to 4(F), which includes the photodiode arrangement shown in FIG. 2(A), light sensitive element 550 is a solar cell similar to that shown in FIG. 2(B). To implement the solar cell, an n-type well region 542 is formed in p-type substrate 510, and a p-type junction region 544 is formed in n-well region 542, which is connected by metal contact to shunt transistor 540.

In another alternative embodiment, connections between the shunt transistor, light sensitive element and word lines are provided by buried polysilicon (i.e., before Metal 1 deposition and etch). A solar cell is formed using non-salicided polysilicon formed over field oxide, and is connected to ground using a polysilicon contact structure (an additional mask is required to provide contact to the substrate through the gate oxide layer). Because all necessary contacts are formed before pre-metal dielectric formation, this alternative embodiment allows protection against high word line voltages during plasma etching of the pre-metal dielectric. Note that charging at the stage of polysilicon patterning is not significant because of discharge that typically occurs during heat treatment of the subsequently formed pre-metal dielectric.

Other embodiments and modifications to the disclosed embodiments will apparent to those of ordinary skill in the art. Therefore, the invention is limited only by the following claims.

What is claimed is:

1. An integrated circuit comprising:
    an array including a plurality of cells fabricated on a substrate;
    a plurality of elongated conductors located over the plurality of cells, each elongated conductor being electrically coupled to a group of said plurality of cells;
    a shunt transistor having a first terminal connected to the elongated conductor, and a second terminal connected to a voltage source; and
    a light sensitive element connected to a gate of the shunt transistor, wherein the light sensitive element turns on the shunt transistor to form a discharge path between the elongated conductor and the voltage source through the shunt transistor when the integrated circuit is exposed to a light source.

2. The integrated circuit according to claim 1, wherein the light sensitive element comprises a first photodiode connected between the voltage source and the gate terminal of the shunt transistor, and a second photodiode connected between the gate terminal of the shunt transistor and the elongated conductor, wherein the first photodiode is covered by a light shield.

3. The integrated circuit according to claim 2, wherein a ratio of the size of the first photodiode to the second photodiode is approximately 50:1.

4. The integrated circuit according to claim 1, wherein the light sensitive element comprises a solar cell.

5. The integrated circuit according to claim 1,
    wherein each cell comprises a floating gate structure extending between first and second diffused bit line regions, and
    wherein each elongated conductor is purposefully capacitively coupled to said group of said plurality of cells.

6. The integrated circuit according to claim 5, wherein the floating gate structure of each cell comprises an oxide-nitride-oxide structure.

7. The integrated circuit according to claim 5, wherein each elongated conductor comprises a polysilicon structure and a silicide structure formed on the polysilicon structure.

8. An integrated circuit comprising:

a plurality of cells fabricated on a substrate;

an elongated conductor located over and electrically coupled to the plurality of cells;

a shunt transistor connected between the elongated conductor and a voltage source; and means for detecting a plasma glow generated during a plasma process, and for generating a voltage on a gate terminal of the shunt transistor while the plasma glow is detected such that the shunt transistor to turned on to form a discharge path between the elongated conductor and the voltage source through the shunt transistor while the plasma glow is detected.

9. The integrated circuit according to claim 8, wherein means comprises a first photodiode connected between the voltage source and the gate terminal of the shunt transistor, and a second photodiode connected between the gate terminal of the shunt transistor and the elongated conductor, wherein the first photodiode is covered by a light shield.

10. The integrated circuit according to claim 9, wherein a ratio of the size of the first photodiode to the second photodiode is approximately 50:1.

11. The integrated circuit according to claim 10, wherein said means comprises a solar cell.

12. The integrated circuit according to claim 8, wherein each cell of the plurality of cells comprises a floating gate structure extending between first and second diffused bit line regions, and wherein each elongated conductor is purposefully capacitively coupled to said group of said plurality of cells.

13. The integrated circuit according to claim 12, wherein the floating gate structure of each cell comprises an oxide-nitride-oxide structure.

* * * * *